United States Patent
Ooka et al.

(10) Patent No.: US 10,236,315 B2
(45) Date of Patent: Mar. 19, 2019

(54) SOLID-STATE IMAGE PICKUP ELEMENT, IMAGE PICKUP APPARATUS, ELECTRONIC APPARATUS, AND PRODUCTION METHOD

(71) Applicant: SONY CORPORATION, Tokyo (JP)

(72) Inventors: Yutaka Ooka, Kanagawa (JP); Shinji Miyazawa, Kanagawa (JP); Kensaku Maeda, Kanagawa (JP); Atsushi Yamamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 24 days.

(21) Appl. No.: 14/775,879

(22) PCT Filed: Mar. 14, 2014

(86) PCT No.: PCT/JP2014/056827
§ 371 (c)(1),
(2) Date: Sep. 14, 2015

(87) PCT Pub. No.: WO2014/156704
PCT Pub. Date: Oct. 2, 2014

(65) Prior Publication Data
US 2016/0027822 A1 Jan. 28, 2016

(30) Foreign Application Priority Data

Mar. 25, 2013 (JP) ................................ 2013-062020
May 28, 2013 (JP) ................................ 2013-111768

(51) Int. Cl.
*H01L 27/14* (2006.01)
*H01L 27/146* (2006.01)

(52) U.S. Cl.
CPC .... *H01L 27/1463* (2013.01); *H01L 27/14621* (2013.01); *H01L 27/14623* (2013.01);
(Continued)

(58) Field of Classification Search
CPC ........................................................ H01L 27/14
See application file for complete search history.

(56) References Cited

U.S. PATENT DOCUMENTS

2012/0086093 A1* 4/2012 Otsuka .............. H01L 27/14621
257/432
2012/0242873 A1* 9/2012 Toumiya ........... H01L 27/14605
348/273

(Continued)

FOREIGN PATENT DOCUMENTS

JP 2007-19435 A 1/2007
JP 2008-270679 11/2008
(Continued)

OTHER PUBLICATIONS

Hsu et al., A High-Efficiency CMOS Image Sensor With Air Gap in situ MicroLens (AGML) Fabricated by 0.18-micrometer CMOS Technology, Sep. 2005, IEE Electron Device Letters, vol. 26, No. 9, pp. 634-636.*

(Continued)

*Primary Examiner* — Matthew Reames
*Assistant Examiner* — Christopher Culbert
(74) *Attorney, Agent, or Firm* — Sheridan Ross P.C.

(57) ABSTRACT

Provided is a solid-state image pickup element including: a sensor unit configured to generate an electrical signal in response to incident light; a color filter covering the sensor unit; and a lens configured to concentrate the incident light into the sensor unit via the color filter and formed by a laminated film made of a predetermined lens material. The lens is formed on the color filter without providing a planarization layer for removing a difference in level in the color filter.

15 Claims, 12 Drawing Sheets

(52) U.S. Cl.
CPC .. *H01L 27/14627* (2013.01); *H01L 27/14629* (2013.01); *H01L 27/14685* (2013.01)

(56) References Cited

U.S. PATENT DOCUMENTS

2012/0320242 A1* 12/2012 Ogita ................ H01L 27/14621
 348/276
2013/0001724 A1* 1/2013 Masuda ............ H01L 27/14623
 257/432

FOREIGN PATENT DOCUMENTS

| | | |
|---|---|---|
| JP | 2012-84608 A | 4/2012 |
| JP | 2012-204354 A | 10/2012 |
| JP | 2013-012506 | 1/2013 |
| JP | 2013-13506 A | 1/2013 |
| JP | 2013-77740 A | 4/2013 |

OTHER PUBLICATIONS

International Search Report prepared by the Japanese Patent Office dated Mar. 28, 2014, for International Application No. PCT/JP2014/056827.

* cited by examiner

SOLID-STATE IMAGE PICKUP ELEMENT, IMAGE PICKUP APPARATUS, ELECTRONIC APPARATUS, AND PRODUCTION METHOD

CROSS REFERENCE TO RELATED APPLICATIONS

This application is a national stage application under 35 U.S.C. 371 and claims the benefit of PCT Application No. PCT/JP2014/056827 having an international filing date of Mar. 14, 2014, which designated the United States, which PCT application claimed the benefit of Japanese Patent Application No. 2013-062020 filed Mar. 25, 2013, and Japanese Patent Application No. 2013-111768 filed May 28, 2013 the disclosures of which are incorporated herein by reference in their entirety.

TECHNICAL FIELD

The present disclosure relates to a solid-state image pickup element, an image pickup apparatus, an electronic apparatus, and a production method, and particularly relates to a solid-state image pickup element, an image pickup apparatus, an electronic apparatus, and a production method, each of which is capable of preventing reduction in photosensitivity and color mixture.

BACKGROUND ART

Conventionally, a solid-state image pickup element typified by a CMOS image sensor is provided in an image pickup apparatus such as a digital still camera or a digital video camera.

FIG. 1 is a cross-sectional view of a conventional and general solid-state image pickup element.

This solid-state image pickup element 10 includes an on-chip lens 11, a color filter 12, a light-shielding unit 13, a sensor unit 14, and the like, which are laminated in this order from a light incident side. Further, in the case where the on-chip lens 11 is made of an inorganic film having a high refractive index, such as SiN, a planarization layer 15 for removing a difference in level in the color filter 12 is provided between the on-chip lens 11 and the color filter 12.

In the solid-state image pickup element 10, incident light is concentrated on a lower layer side by the on-chip lens 11 and is incident on the sensor unit 14 via the color filter 12, and photoelectric conversion is performed in the sensor unit 14.

In the general solid-state image pickup element 10, the on-chip lenses 11 corresponding to respective pixels are made of the same material so as to be integrally connected in a transverse direction. With this, as illustrated in FIG. 1, some of light that has been incident on a region corresponding to a certain pixel of the on-chip lens 11 may leak to an adjacent pixel and may be incident on the sensor unit 14 of the adjacent pixel without reaching the sensor unit 14 on which the light should be originally incident. Such a phenomenon leads to reduction in photosensitivity and deterioration of color mixture, and therefore some countermeasure is needed.

In view of this, as a countermeasure against the above phenomenon, the applicant of the present disclosure proposed a solid-state image pickup element in which a groove is provided in a boundary between regions corresponding to respective pixels of on-chip lenses 11 which are integrally formed (e.g., see Patent Literature 1).

FIG. 2 is a cross-sectional view of a solid-state image pickup element in which the above countermeasure is employed.

In this solid-state image pickup element 20, light is totally reflected in a groove 21 in the boundary between the regions corresponding to the respective pixels of the on-chip lenses 11. This makes it possible to prevent incident light from leaking to the sensor unit 14 of the adjacent pixel from the sensor unit 14 of the pixel on which the incident light should be originally incident and to prevent color mixture.

CITATION LIST

Patent Literature

Patent Literature 1: JP 2008-270679A

SUMMARY OF INVENTION

Technical Problem

As illustrated in FIG. 2, a photolithography technology is usually used in a step of providing the groove 21 in the on-chip lens 11. In the case where the photolithography technology is used, superposition of a position of the groove 21 is easily shifted.

Further, a width of the groove 21 is several hundreds nm, and therefore the width of the groove 21 in the on-chip lens 11 is relatively large and an area of the on-chip lens 11 is small. This deteriorates concentration efficiency.

Further, as illustrated in, for example, FIG. 3, in a solid-state image pickup element 30 in which a film 31 made of another material that is different from that of the on-chip lens 11 is formed on the on-chip lens 11 having the groove 21, the another material enters the groove 21. In this case, a difference in a refractive index between the on-chip lens 11 and the another material entering the groove 21 becomes small, and therefore an effect of preventing leakage of incident light, which is obtained by providing the groove 21, is reduced.

Furthermore, in the case where the planarization layer 15 is provided as illustrated in FIG. 1 to FIG. 3, a distance between the on-chip lens 11 and the sensor unit 14 is increased by a length of the planarization layer 15. Therefore, problems such as degradation of sensitivity, degradation of a defect, and deterioration of an oblique light incidence characteristic may also arise.

The present disclosure has been made in view of those circumstances and can prevent degradation of sensitivity of a solid-state image pickup element.

Solution to Problem

According to a first aspect of the present disclosure, there is provided a solid-state image pickup element including: a sensor unit configured to generate an electrical signal in response to incident light; a color filter covering the sensor unit; and a lens configured to concentrate the incident light into the sensor unit via the color filter and formed by a laminated film made of a predetermined lens material. The lens is formed on the color filter without providing a planarization layer for removing a difference in level in the color filter.

A slit can be provided in the lens and an upper side of the slit can be covered.

A refractive index adjustment film can be provided between the color filter and the lens.

The refractive index adjustment film can be SiON.

The slit can be provided in a boundary between regions corresponding to respective pixels of the lens.

The upper side of the slit can be covered by the same predetermined lens material as the material of the lens or SiON different from the lens material.

The predetermined lens material can be SiN.

The solid-state image pickup element can be a front-surface irradiation type or back-surface irradiation type image sensor.

The solid-state image pickup element as the first aspect of the present disclosure can further include a film made of a material having a refractive index smaller than a refractive index of the predetermined lens material, the film being provided on the lens.

The solid-state image pickup element can have a CSP structure.

The slit can have a width less than 100 nm.

According to a second aspect of the present disclosure, there is provided an image pickup apparatus including a solid-state image pickup element. The solid-state image pickup element includes a sensor unit configured to generate an electrical signal in response to incident light, a color filter covering the sensor unit, and a lens configured to concentrate the incident light into the sensor unit via the color filter and formed by a laminated film made of a predetermined lens material, the lens being formed on the color filter without providing a planarization layer for removing a difference in level in the color filter.

According to a third aspect of the present disclosure, there is provided an electronic apparatus including an image-pickup unit. A solid-state image pickup element included in the image-pickup unit includes a sensor unit configured to generate an electrical signal in response to incident light, a color filter covering the sensor unit, and a lens configured to concentrate the incident light into the sensor unit via the color filter and formed by a laminated film made of a predetermined lens material, the lens being formed on the color filter without providing a planarization layer for removing a difference in level in the color filter.

In the first to third aspects of the present disclosure, incident light concentrated by the lens is incident on the sensor unit not via the planarization layer but via the color filter.

According to a fourth aspect of the present disclosure, there is provided a method of producing a solid-state image pickup element, the solid-state image pickup element including a sensor unit configured to generate an electrical signal in response to incident light, and a lens configured to concentrate the incident light into the sensor unit and formed by a laminated film made of a predetermined lens material. A slit is provided in the lens and an upper side of the slit is covered. The method includes: forming a layer made of the lens material in a manner that the layer has a hemispherical shape for each pixel; further laminating the same lens material on the lens material having been formed to have the hemispherical shape, to increase a size of the hemispherical lens material; performing etching on a joining region of the hemispherical shapes of the lens material corresponding to the respective pixels, the size of the hemispherical lens material having been increased, to provide the slit; and performing film formation on the lens material in which the slit has been provided.

In the fourth aspect of the present disclosure, the layer made of the lens material is formed to have a hemispherical shape for each pixel, the same lens material is further laminated on the lens material having been formed to have the hemispherical shape, to increase a size of the hemispherical lens material, a joining region of the hemispherical shapes of the lens material corresponding to the respective pixels, the size of the hemispherical lens material having been increased, is subjected to etching to provide the slit, and film formation is performed on the lens material in which the slit has been provided.

Advantageous Effects of Invention

According to the first to third aspects of the present disclosure, it is possible to prevent degradation of sensitivity.

According to the fourth aspect of the present disclosure, it is possible to produce a solid-state image pickup element capable of preventing degradation of sensitivity.

DESCRIPTION OF EMBODIMENTS

Hereinafter, best modes (hereinafter, referred to as embodiments) for implementing the present disclosure will be described in detail with reference to drawings.

[Configuration Example of Solid-State Image Pickup Element 50 According to Embodiment 1 of the Present Disclosure]

Figure 1:
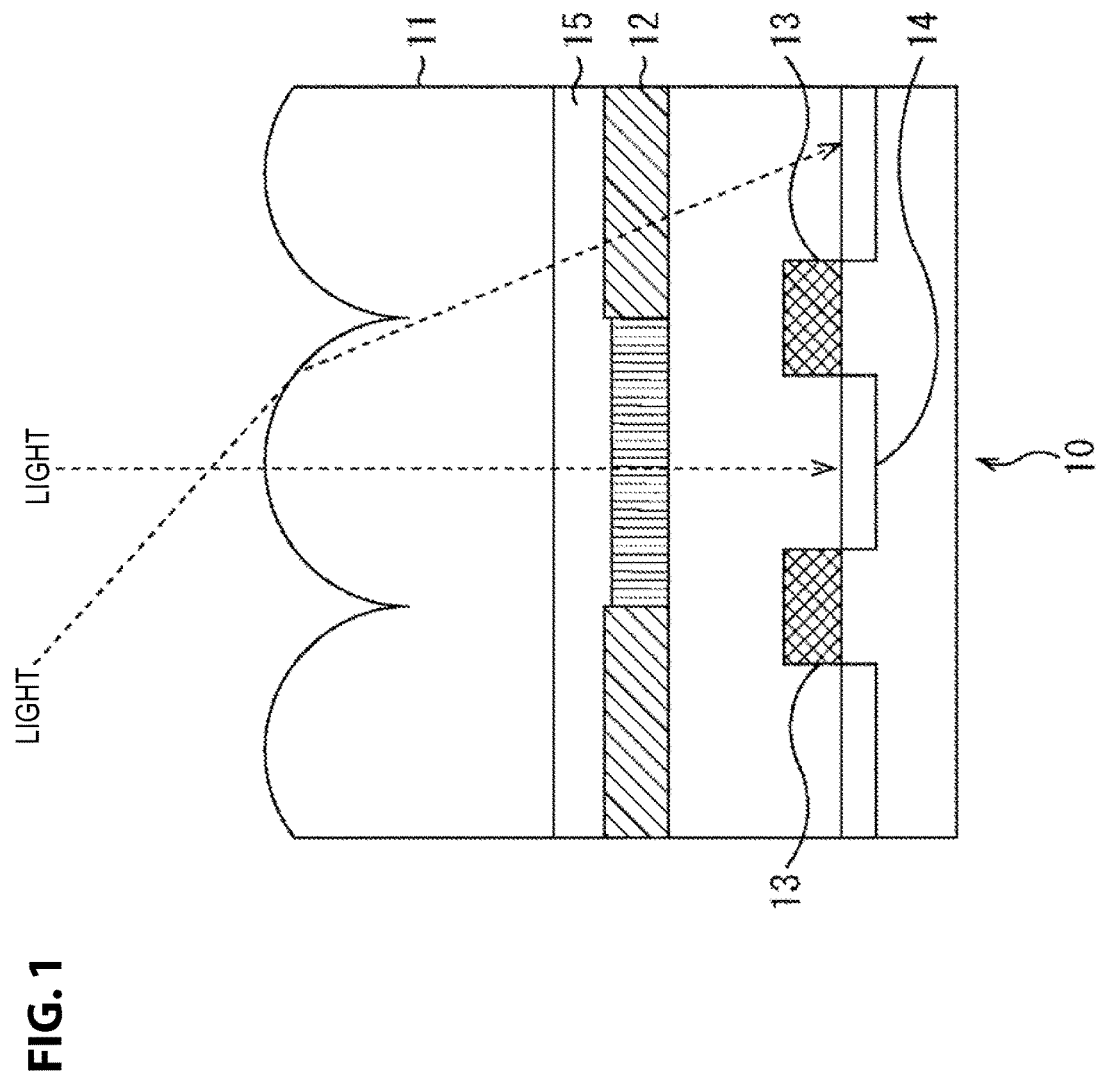
FIG. 1 is a cross-sectional view of a conventional and general solid-state image pickup element.
Figure 4:
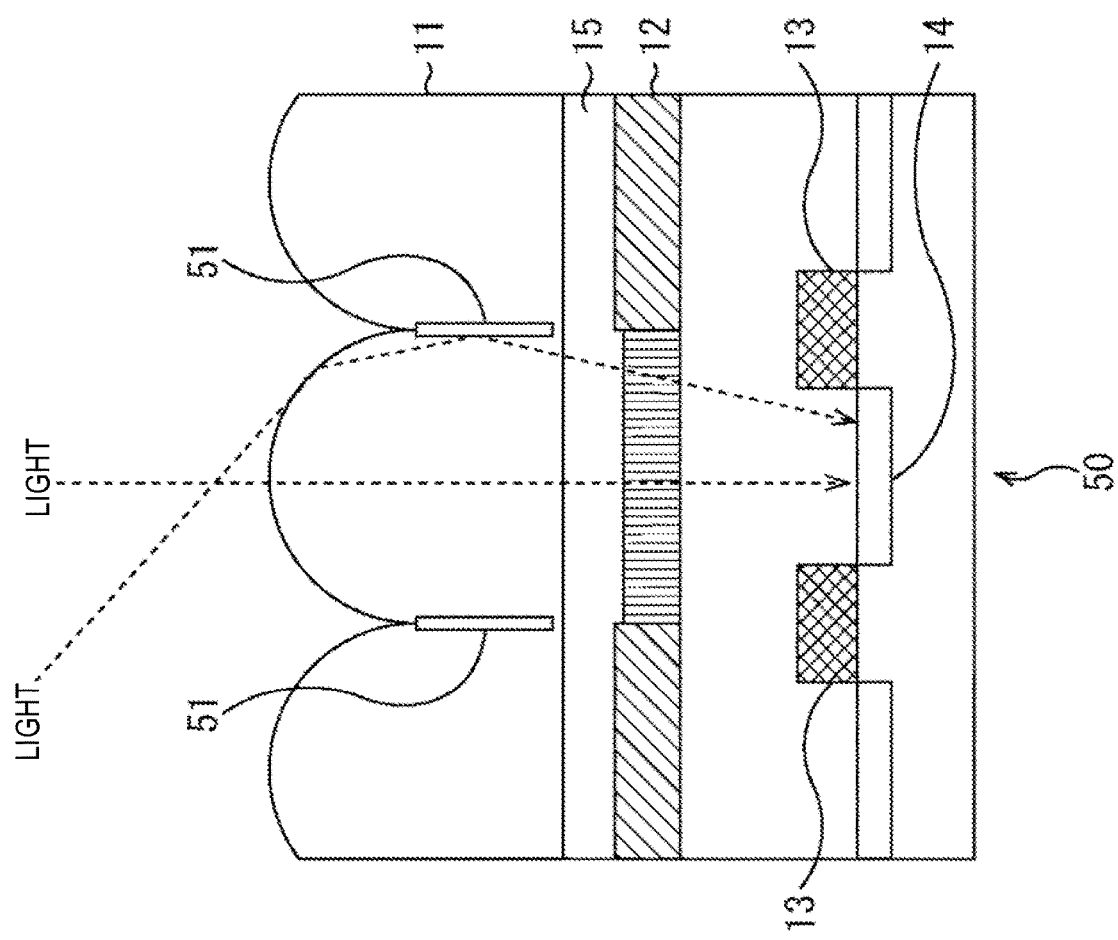
FIG. 4 is a cross-sectional view of a solid-state image pickup element according to Embodiment 1 of the present disclosure.

FIG. 4 is a cross-sectional view of a solid-state image pickup element 50 according to Embodiment 1 of the present disclosure. Among constituent elements of the solid-state image pickup element 50, constituent elements which are in common with those of the solid-state image pickup element 10 of the FIG. 1 are denoted by common reference signs.

The solid-state image pickup element 50 includes an on-chip lens 11, a planarization layer 15, a color filter 12, a light-shielding unit 13, and a sensor unit 14 which are laminated in this order from a side on which light is incident, and a slit 51 is provided in a boundary between regions corresponding to respective pixels inside the on-chip lens 11.

Note that, although not illustrated, a film made of, for example, a resin material having a smaller refractive index than that of the on-chip lens 11 may be formed on the on-chip lens 11 in which the slit 51 is provided.

Figure 5:
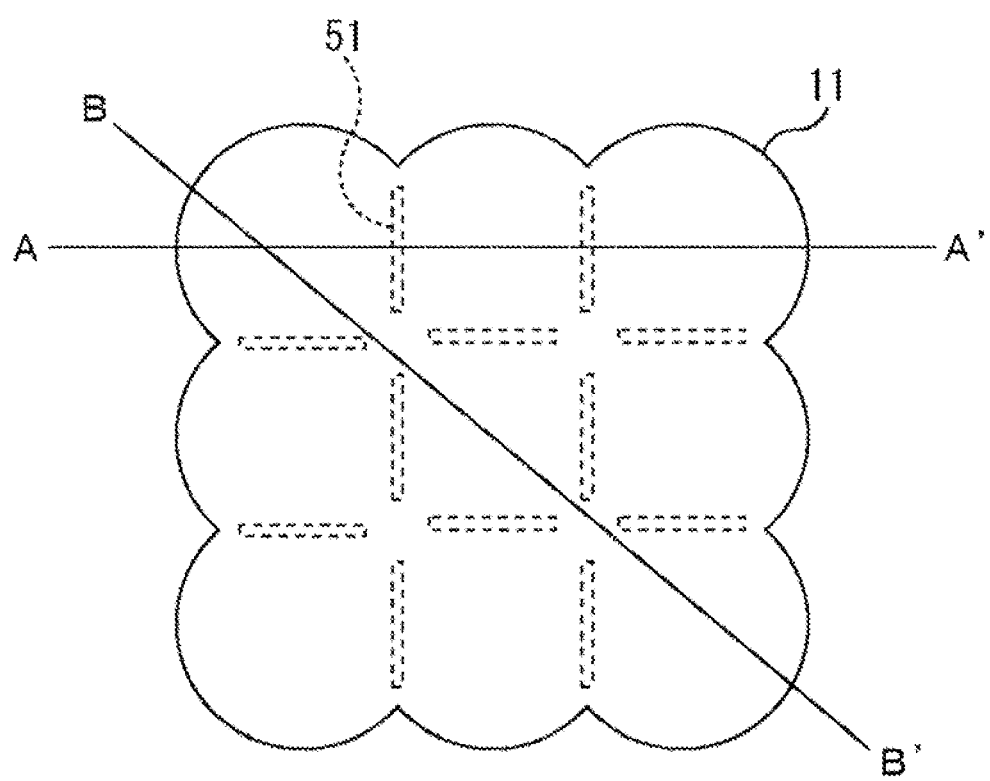
FIG. 5 is a top view of a solid-state image pickup element according to Embodiment 1 of the present disclosure.

FIG. 5 is a top view of the solid-state image pickup element 50. As illustrated in FIG. 5, the slits 51 are provided in boundaries between regions corresponding to pixels that are vertically and horizontally adjacent to one another in the on-chip lens 11. In other words, the region corresponding to each pixel of the on-chip lens 11 is surrounded by the slits 51.

Note that the cross-sectional view illustrated in FIG. 4 is a cross-section taken along a line segment AA' illustrated in FIG. 5, and no slit 51 exists in a cross-section (not illustrated) taken along a line segment BB' illustrated in FIG. 5.

In the solid-state image pickup element 50, incident light is concentrated on a lower layer side by the on-chip lens 11 and is incident on the sensor unit 14 via the color filter 12, and photoelectric conversion is performed in the sensor unit 14.

Figure 2:
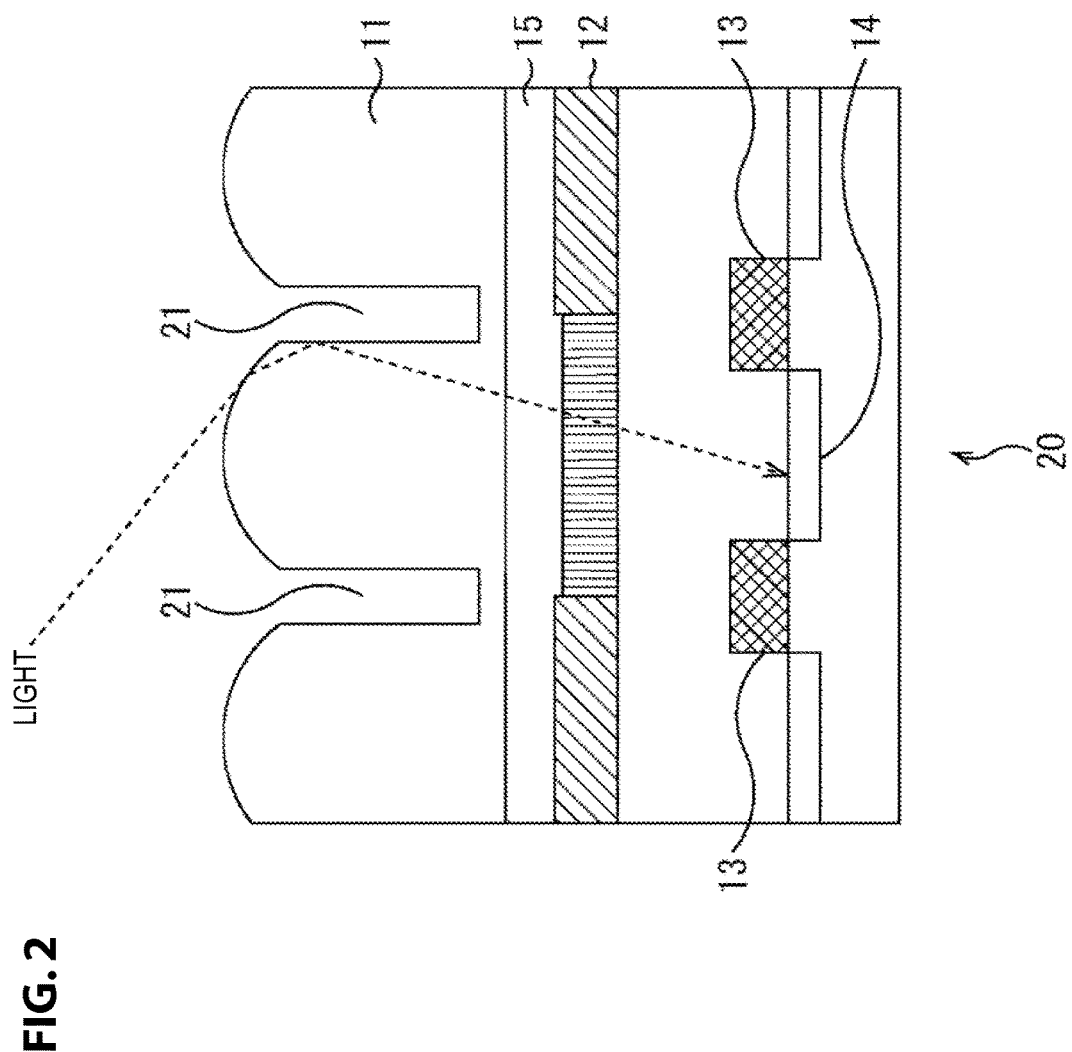
FIG. 2 is a cross-sectional view of a solid-state image pickup element in which a groove is provided in a conventional on-chip lens.

Note that the slit 51 of the solid-state image pickup element 50 and the groove 21 of the fixed image pickup element 20 illustrated in FIG. 2 are different in that the slit 51 is satisfactorily narrower than the groove 21. Specifically, a width of the groove 21 formed by the photolithography technology is several hundreds nm, whereas a width of the slit 51 formed by plasma etching (EB) is several nm. Note that the width of the slit 51 is desirably less than a hundred nm.

Further, an upper portion of the groove 21 is open, whereas an upper portion of the slit 51 is covered by, for example, the same material as that of the on-chip lens 11. Note that formation of the slit 51 will be described below with reference to FIG. 8 and FIG. 9.

Figure 6:
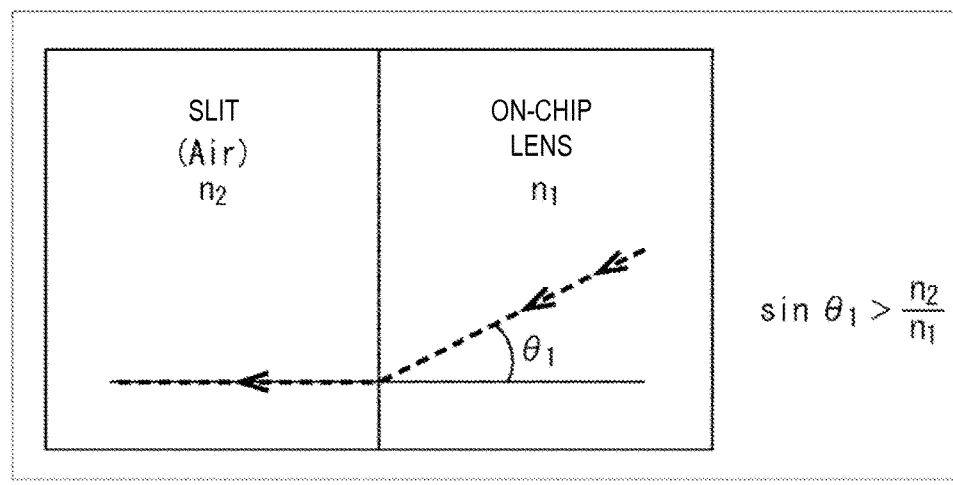
FIG. 6 illustrates a total reflection angle caused by a slit.

FIG. 6 illustrates a total reflection angle caused by the slit 51. Assuming that refractive indexes of the on-chip lens 11 and the slit 51 (i.e., air) are $n_1$ and $n_2$, respectively, and the total reflection angle is $\theta_1$, the following relationship is known.

$$\sin \theta_1 > n_2/n_1$$

For example, in the case where the on-chip lens 11 is made of a conventional and general material, the total reflection angle $\theta_1$ is 43 degrees, and, in the case where the on-chip lens 11 is made of SiN, the total reflection angle $\theta_1$ is 30 degrees.

Figure 7:
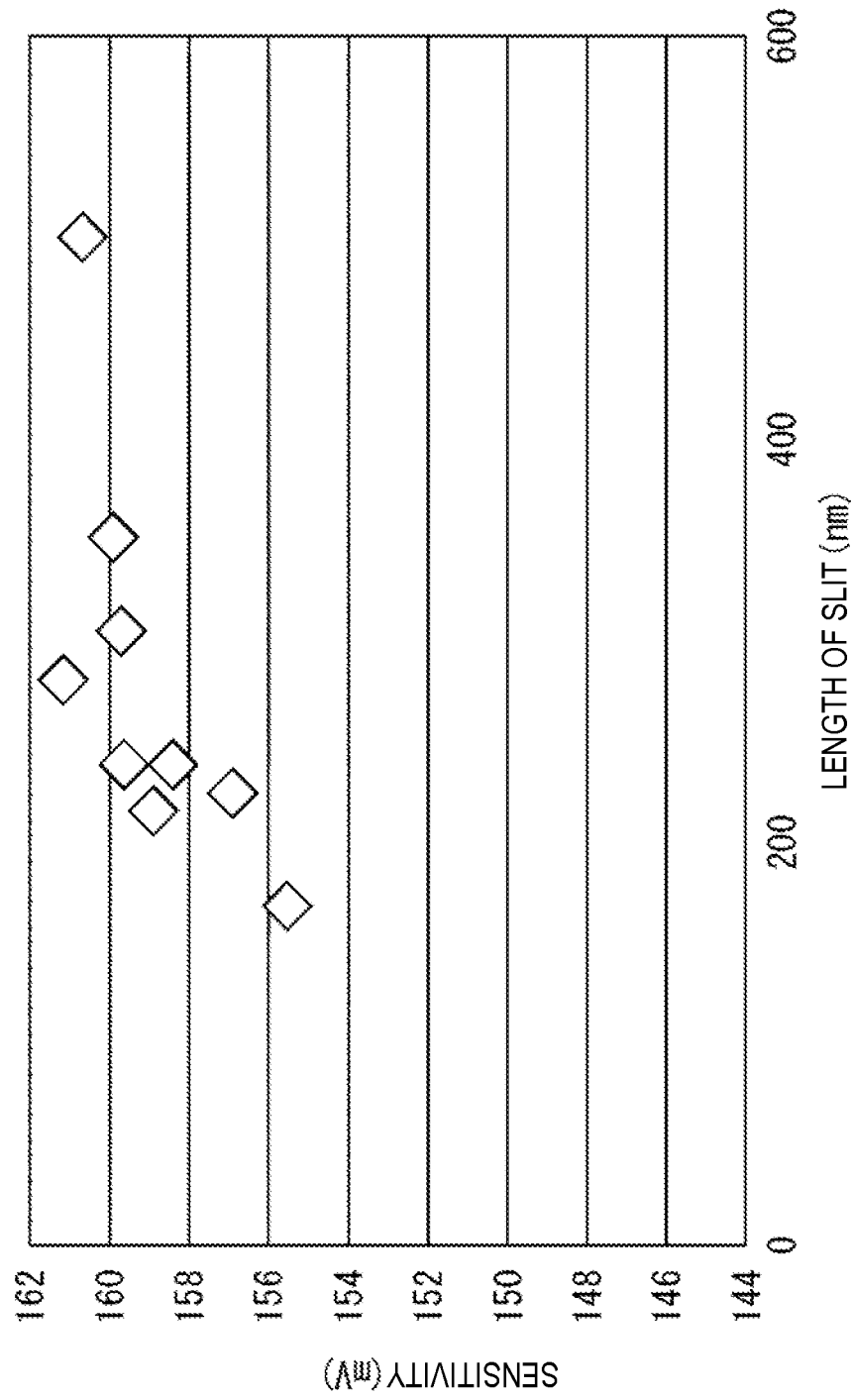
FIG. 7 shows a relationship between a length of a slit and photosensitivity.

FIG. 7 shows results of verification of a relationship between a length (depth) of the slit 51 and photosensitivity. As is clear from FIG. 7, it is found that the photosensitivity is improved as the length of the slit 51 is increased.

[Production Method]

Forming processing of the slit 51 of the solid-state image pickup element 50 according to an embodiment of the present disclosure will be described with reference to FIG. 8 and FIG. 9.

Figure 8:
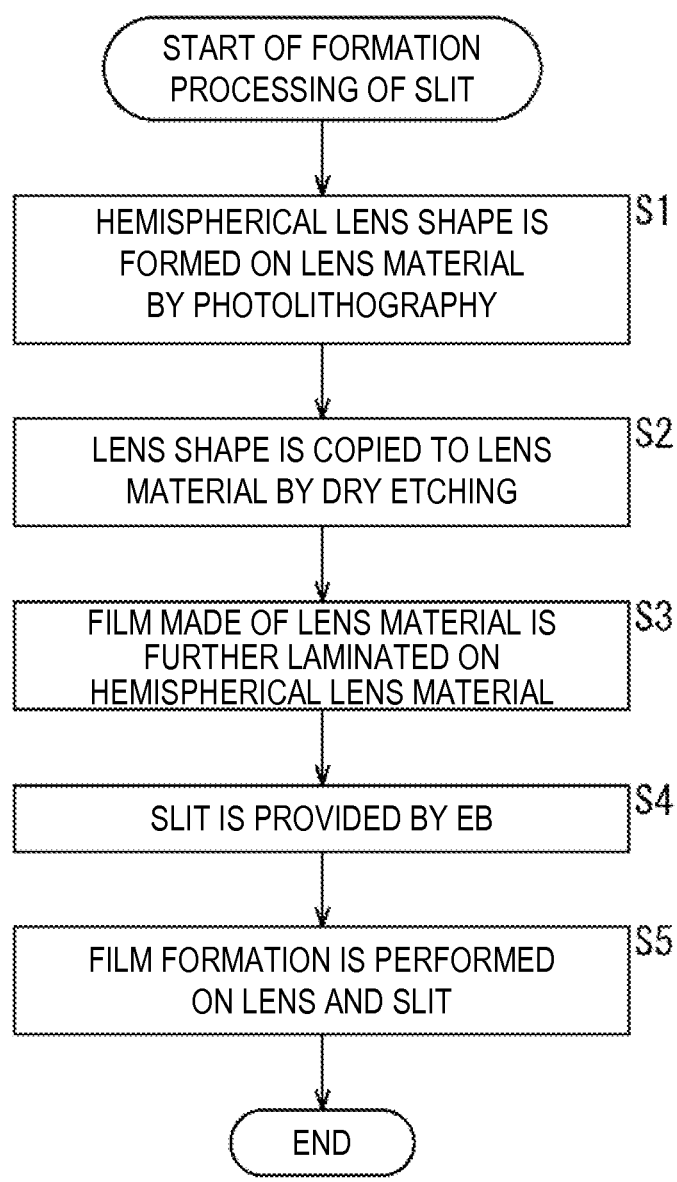
FIG. 8 is a flowchart showing formation processing of a slit.

FIG. 8 is a flowchart showing the formation processing of the slit 51 of the solid-state image pickup element 50. FIG. 9 is cross-sectional views of the solid-state image pickup element 50 for describing steps in which the slit 51 is formed. Note that, in FIG. 9, illustration of a lower layer side below the color filter 12 of the solid-state image pickup element 50 is omitted.

Figure 9:
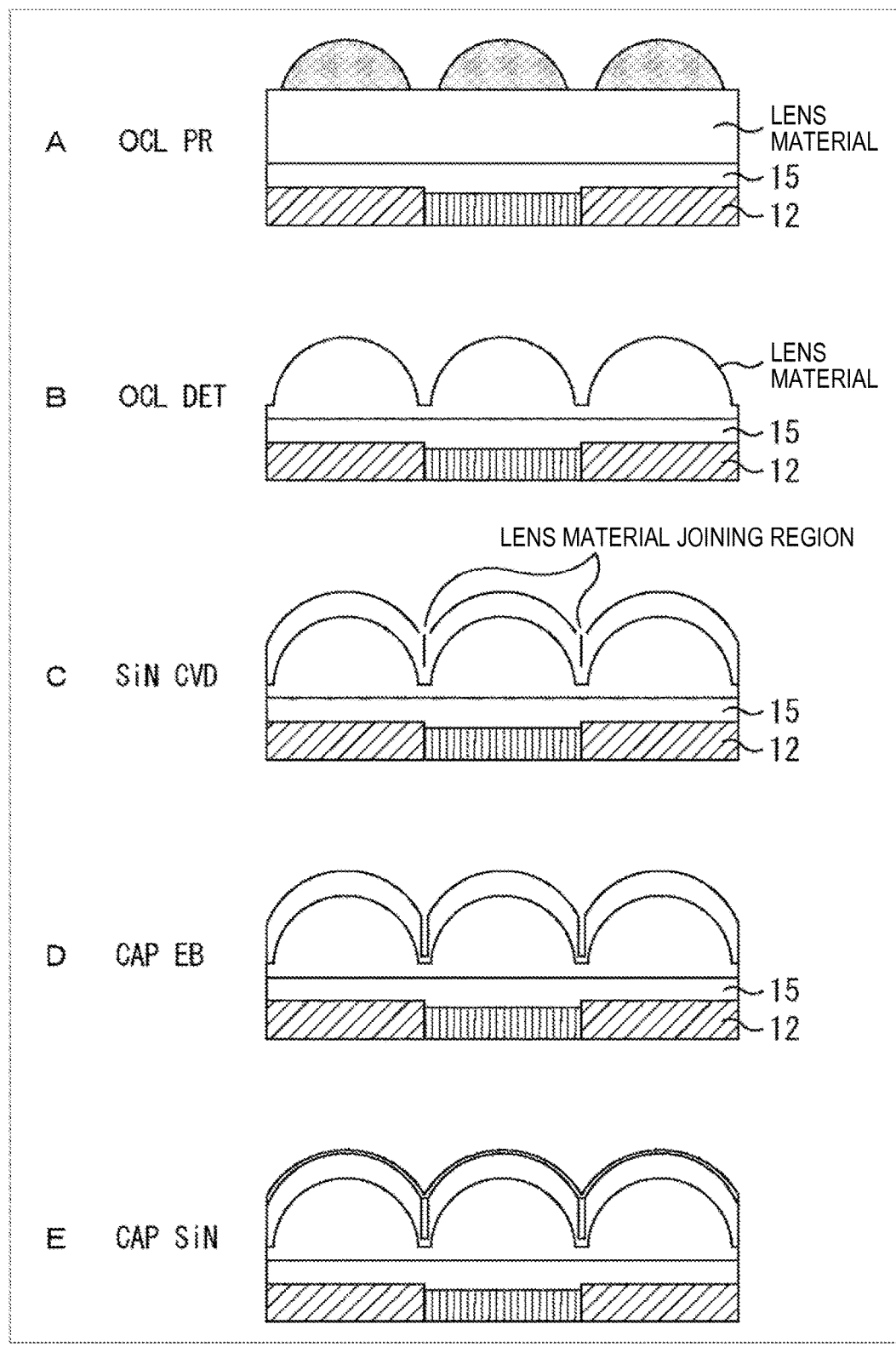
FIG. 9 illustrates processes of formation processing of a slit.

In Step S1, as illustrated in A of FIG. 9, the planarization layer 15 is provided on the color filter 12, and a layer made of a lens material (e.g., SiN) having a high refractive index is formed as the on-chip lens 11 on the planarization layer 15. Further, a hemispherical lens shape is formed on the layer made of the lens material by the photolithography technology.

In Step S2, as illustrated in B of FIG. 9, the lens shape formed in Step S1 is copied to the lens material by dry etching.

In Step S3, as illustrated in C of FIG. 9, a layer made of the same lens material is further laminated on the lens material having the lens shape. In a process for laminating this film, a lens material joining region whose film quality is weak is accurately formed in a position where hemispheres of the lens material gradually become large and the hemispheres are joined with each other (i.e., a position where the slit 51 is provided).

Note that, although C of FIG. 9 illustrates a line indicating a boundary between a hemispherical part copied to the lens material in Step S2 and a part laminated in Step S3, those parts are actually made of the same material, and therefore an optical boundary does not exist. The same applies to D of FIG. 9 and E of FIG. 9 described below.

In Step S4, as illustrated in D of FIG. 9, the slit 51 is provided by etching in the lens material joining region where the hemispheres are joined with each other. Note that, because the lens material joining region has weak film quality, the slit 51 can be easily and quickly provided by etching. Because the lens material joining region accurately exists in a boundary between the hemispheres and the lens material joining region is subjected to etching, the slit 51 can be formed by self-alignment.

In Step S5, as illustrated in E of FIG. 9, film formation using the same lens material is performed on the slit 51 to cover the upper portion of the slit 51. Further, film formation using a material (e.g., SiON) different from the same lens material may be performed on the on-chip lens 11 having the slit 51 whose upper portion is covered, and a resin film may be formed thereon. Then, the description of the formation processing of the slit 51 is terminated.

As described above, the solid-state image pickup element 50 in which the slit 51 is provided can cause light that leaks to an adjacent pixel inside the on-chip lens 11 in the solid-state image pickup element 10 illustrated in FIG. 1 to be totally reflected in the slit 51 and be incident on the sensor unit 14 of an original pixel. Therefore, it is possible to improve photosensitivity and prevent color mixture.

Further, because the upper portion of the slit 51 is covered, it is possible to prevent reduction in concentration efficiency caused by decrease in the area of the on-chip lens 11, unlike the solid-state image pickup element 20 illustrated in FIG. 2.

Figure 3:
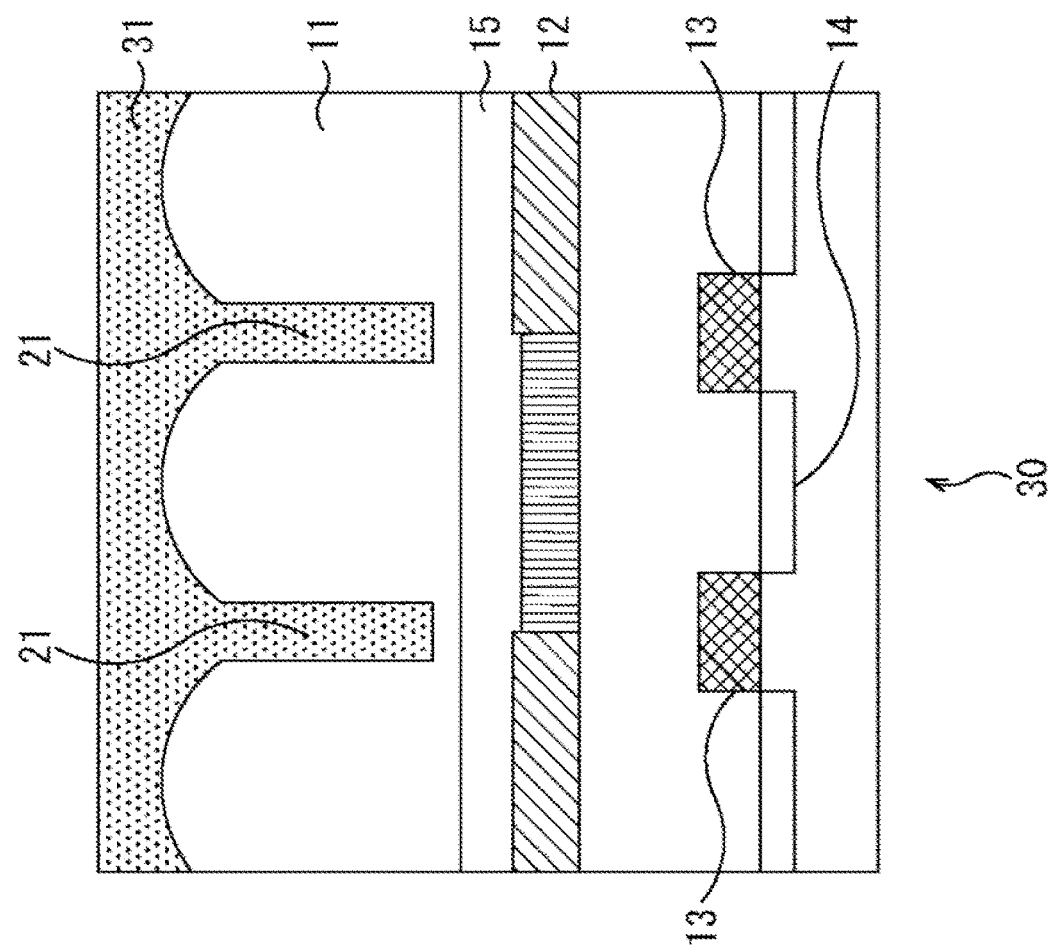
FIG. 3 is a cross-sectional view of a solid-state image pickup element in which a film made of another material is formed on an on-chip lens.

Furthermore, a film made of another material having a smaller refractive index than that of the lens material may be formed on the on-chip lens 11, as in the solid-state image pickup element 30 of FIG. 3. Also in this case, because the upper portion of the slit 51 is covered, the another material does not enter the slit 51, and therefore it is possible to prevent reduction in an effect of total reflection caused by the slit 51.

[Configuration Example of Solid-State Image Pickup Element 60 According to Embodiment 2 of the Present Disclosure]

Figure 10:
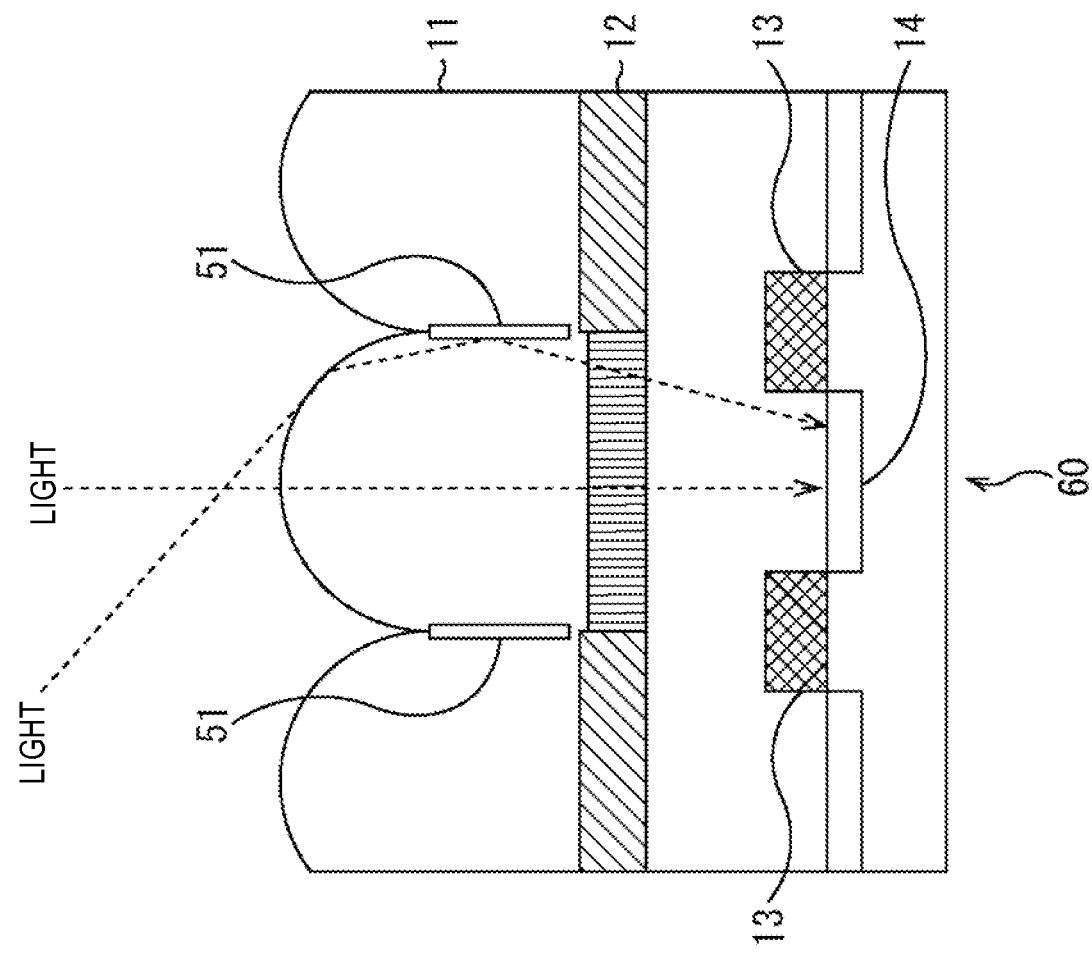
FIG. 10 is a cross-sectional view of a solid-state image pickup element according to Embodiment 2 of the present disclosure.

FIG. 10 is a cross-sectional view of a solid-state image pickup element 60 according to Embodiment 2 of the present disclosure. The solid-state image pickup element 60 is obtained by removing the planarization layer 15 from the solid-state image pickup element 50 of FIG. 4.

That is, in the solid-state image pickup element 60, the on-chip lens 11 is formed directly on the color filter 12. Note that, also in the solid-state image pickup element 60, a film made of, for example, a resin material having a smaller refractive index than that of the on-chip lens 11 may be formed on the on-chip lens 11 in which the slit 51 is provided.

In the solid-state image pickup element 60, a distance between the on-chip lens 11 and the sensor unit 14 is decreased by the length of the removed planarization layer 15, as compared to the solid-state image pickup element 50. This makes it possible to prevent degradation of sensitivity, degradation of a defect, deterioration of an oblique light incidence characteristic, and the like.

Note that a production method of the solid-state image pickup element 60 is similar to the above-mentioned production method of the solid-state image pickup element 50, and therefore the description thereof is omitted.

[Configuration Example of Solid-State Image Pickup Element 70 According to Embodiment 3 of the Present Disclosure]

Figure 11:
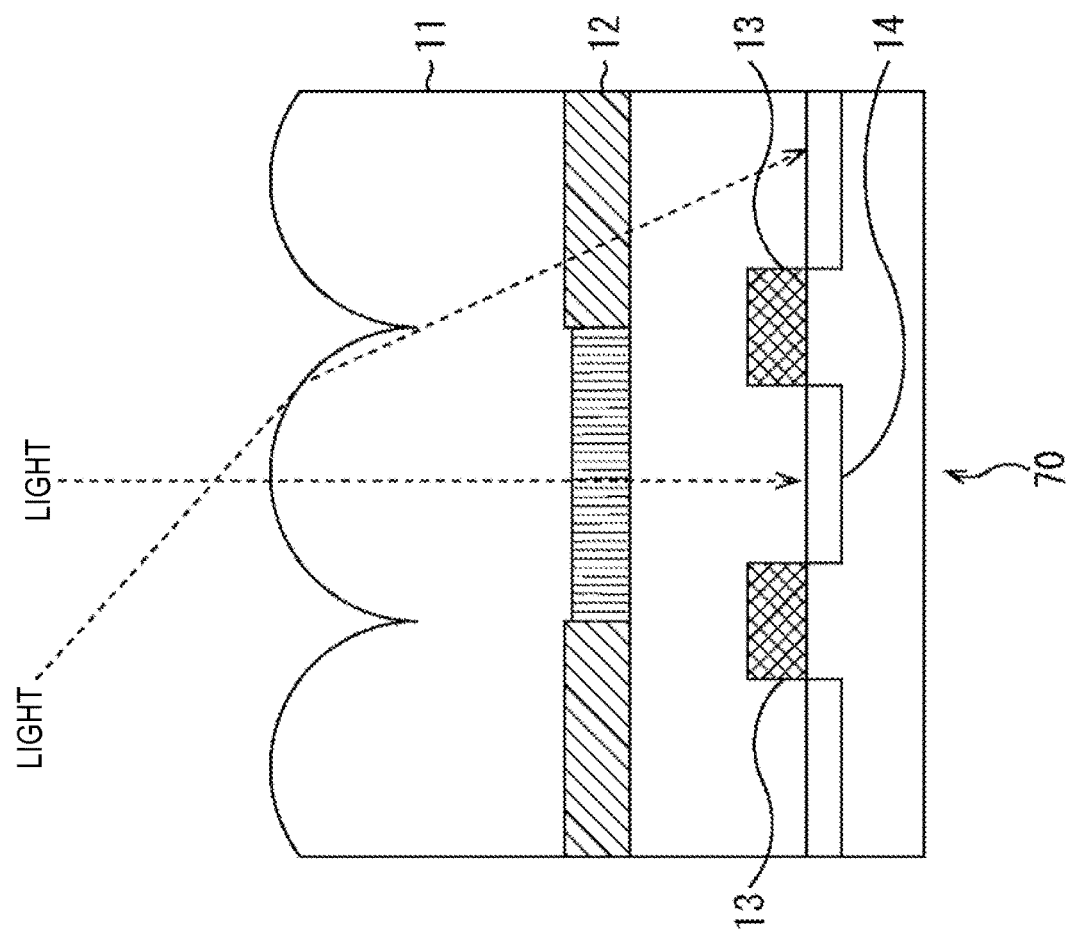
FIG. 11 is a cross-sectional view of a solid-state image pickup element according to Embodiment 3 of the present disclosure.

FIG. 11 is a cross-sectional view of a solid-state image pickup element 70 according to Embodiment 3 of the present disclosure. The solid-state image pickup element 70 is obtained by removing the planarization layer 15 from the solid-state image pickup element 10 of FIG. 1.

That is, in the solid-state image pickup element 70, the on-chip lens 11 is formed directly on the color filter 12. Note that, also in the solid-state image pickup element 70, a film made of, for example, a resin material having a smaller refractive index than that of the on-chip lens 11 may be formed.

Because the slit 51 is not provided in the on-chip lens 11 in the solid-state image pickup element 70, unlike Embodiments 1 and 2 described above, and therefore the solid-state image pickup element 70 cannot have effects that improve photosensitivity and prevent color mixture. However, the distance between the on-chip lens 11 and the sensor unit 14 is decreased by the length of the removed planarization layer 15, as compared to the solid-state image pickup element 10 illustrated in FIG. 1. This makes it possible to prevent degradation of sensitivity, degradation of a defect, deterioration of an oblique light incidence characteristic, and the like.

Note that a production method of the solid-state image pickup element 70 is similar to the above-mentioned production method of the solid-state image pickup element 50, except that a step of providing the slit 51 is omitted, and therefore the description thereof is omitted.

[Configuration Example of Solid-State Image Pickup Element 80 According to Embodiment 4 of the Present Disclosure]

Figure 12:
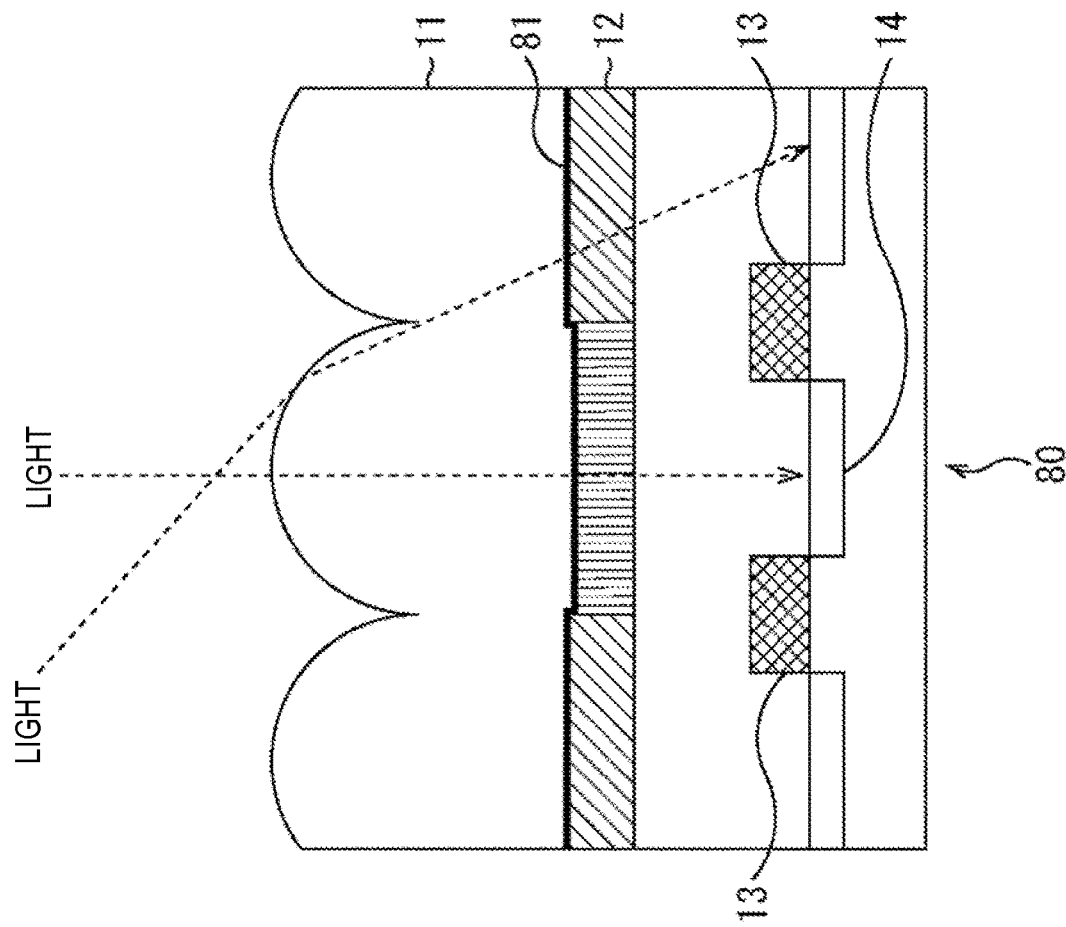
FIG. 12 is a cross-sectional view of a solid-state image pickup element according to Embodiment 4 of the present disclosure.

FIG. 12 is a cross-sectional view of a solid-state image pickup element 80 according to Embodiment 4 of the present disclosure. The solid-state image pickup element 80 is obtained by removing the planarization layer 15 from the solid-state image pickup element 10 of FIG. 1 and providing, on the color filter 12, a refractive index adjustment film 81 made of, for example, SiON having an intermediate refractive index between the refractive index of the on-chip lens 11 and the refractive index of the color filter 12.

That is, in the solid-state image pickup element 80, the refractive index adjustment film 81 is formed on the color filter 12 and the on-chip lens 11 is formed thereon. Note that, also in the solid-state image pickup element 80, a thin film made of, for example, a resin material having a smaller refractive index than that of the on-chip lens 11 may be formed.

Because the slit 51 is not provided in the on-chip lens 11 in the solid-state image pickup element 80, unlike Embodiments 1 and 2 described above, and therefore the solid-state image pickup element 80 cannot have effects that improve photosensitivity and prevent color mixture. However, the distance between the on-chip lens 11 and the sensor unit 14 is decreased by the length of the removed planarization layer 15, as compared to the solid-state image pickup element 10 illustrated in FIG. 1. This makes it possible to prevent degradation of sensitivity, degradation of a defect, deterioration of an oblique light incidence characteristic, and the like. Further, because the refractive index adjustment film 81 is provided, interface reflection can be prevented, and therefore improvement of sensitivity can be expected. Note that, also in Embodiments 1 and 2, the refractive index adjustment film 81 can be provided.

Note that a production method of the solid-state image pickup element 70 is similar to the above-mentioned production method of the solid-state image pickup element 50, except that a step of providing the refractive index adjustment film 81 on the color filter 12 is added and a step of providing the slit 51 is omitted, and therefore the description thereof is omitted.

Note that the solid-state image pickup elements 50, 60, 70, and 80 according to Embodiments 1 to 4 can be applied to both of front-surface irradiation type and back-surface irradiation type image sensors. Further, the solid-state image pickup elements 50, 60, 70, and 80 are suitable in the case where a chip size package (CSP) structure is employed.

Further, the solid-state image pickup elements 50, 60, 70, and 80 according to Embodiments 1 to 4 can be applied to not only image pickup apparatuses such as a digital video camera and a digital still camera but also arbitrary electronic apparatuses including an image-pickup unit.

Note that embodiments of the present disclosure are not limited to the above-mentioned embodiments and various modifications can be performed within the scope of the present disclosure.

Additionally, the present technology may also be configured as below.

(1)
A solid-state image pickup element including:
a sensor unit configured to generate an electrical signal in response to incident light;
a color filter covering the sensor unit; and
a lens configured to concentrate the incident light into the sensor unit via the color filter and formed by a laminated film made of a predetermined lens material,
wherein the lens is formed on the color filter without providing a planarization layer for removing a difference in level in the color filter.

(2)
The solid-state image pickup element according to (1),
wherein a slit is provided in the lens and an upper side of the slit is covered.

(3)
The solid-state image pickup element according to (1) or (2),
wherein a refractive index adjustment film is provided between the color filter and the lens.

(4)
The solid-state image pickup element according to (2),
wherein the refractive index adjustment film is SiON.

(5)
The solid-state image pickup element according to any of (1) to (4),
wherein the slit is provided in a boundary between regions corresponding to respective pixels of the lens.
(6)
The solid-state image pickup element according to any of (1) to (5),
wherein the upper side of the slit is covered by the same predetermined lens material as the material of the lens or SiON different from the lens material.
(7)
The solid-state image pickup element according to (6),
wherein the predetermined lens material is SiN.
(8)
The solid-state image pickup element according to any of (1) to (7),
wherein the solid-state image pickup element is a front-surface irradiation type or back-surface irradiation type image sensor.
(9)
The solid-state image pickup element according to any of (1) to (8), further including:
a film made of a material having a refractive index smaller than a refractive index of the predetermined lens material, the film being provided on the lens.
(10)
The solid-state image pickup element according to any of (1) to (9),
wherein the solid-state image pickup element has a CSP structure.
(11)
The solid-state image pickup element according to any of (2) to (10),
wherein the slit has a width less than 100 nm.

REFERENCE SIGNS LIST 11 on-chip lens
12 color filter
13 light-shielding unit
14 sensor unit
15 planarization layer
50 solid-state image pickup element
51 slit
60, 70, 80 solid-state image pickup element
81 refractive index adjustment film

What is claimed is:

1. A solid-state image pickup element comprising:
a sensor unit configured to generate an electrical signal in response to incident light;
a color filter covering the sensor unit;
a lens configured to concentrate the incident light into the sensor unit via the color filter, the lens comprising a laminated film that includes first, second, and third layers made of a lens material; and
a slit defined by an air cavity that is entirely surrounded by the lens material, the slit configured to reflect the incident light toward the sensor unit,
wherein the first layer is on the color filter, the second layer is on the first layer, and the third layer is on the second layer,
wherein, in a cross-sectional view, first, second, and third sides of the slit are defined by the second layer and a fourth side of the slit is defined by the third layer, and
wherein the slit has a width of less than 100 nm.

2. The solid-state image pickup element according to claim 1,
wherein a refractive index adjustment film is provided between the color filter and the lens.

3. The solid-state image pickup element according to claim 2,
wherein the refractive index adjustment film is SiON.

4. The solid-state image pickup element according to claim 1,
wherein the slit is provided in the lens material at a boundary between regions corresponding to respective pixels.

5. The solid-state image pickup element according to claim 1, further comprising:
a fourth layer on the third layer, wherein the first layer, the second layer, and the third layer are made of a first material, and the fourth layer is made of a second material different from the first material.

6. The solid-state image pickup element according to claim 5,
wherein the first material is SiN and the second material is SiON.

7. The solid-state image pickup element according to claim 1,
wherein the solid-state image pickup element is a front-surface irradiation type or back-surface irradiation type image sensor.

8. The solid-state image pickup element according to claim 1, further comprising:
a film made of a material having a refractive index smaller than a refractive index of the lens material, the film being provided on the lens.

9. The solid-state image pickup element according to claim 1,
wherein the solid-state image pickup element has a chip size package (CSP) structure.

10. The solid-state image pickup element according to claim 1,
wherein the lens is formed on the color filter without providing a planarization layer for removing a difference in level in the color filter.

11. The solid state image pickup element according to claim 1, wherein the air cavity has a lower refractive index than the lens.

12. An image pickup apparatus comprising:
a solid-state image pickup element, wherein the solid-state image pickup element includes:
a sensor unit configured to generate an electrical signal in response to incident light;
a color filter covering the sensor unit;
a lens configured to concentrate the incident light into the sensor unit via the color filter, the lens comprising a laminated film that includes first, second, and third layers made of a lens material; and
a slit defined by an air cavity that is entirely surrounded by the lens material, the slit configured to reflect the incident light toward the sensor unit,
wherein the first layer is on the color filter, the second layer is on the first layer, and the third layer is on the second layer,
wherein, in a cross-sectional view, first, second, and third sides of the slit are defined by the second layer and a fourth side of the slit is defined by the third layer, and
wherein the slit has a width of less than 100 nm.

13. The image pickup apparatus of claim 12, wherein the lens is formed on the color filter without providing a planarization layer for removing a difference in level in the color filter.

14. An electronic apparatus comprising:
   an image-pickup unit, wherein a solid-state image pickup element included in the image-pickup unit includes:
      a sensor unit configured to generate an electrical signal in response to incident light;
      a color filter covering the sensor unit; and
      a lens configured to concentrate the incident light into the sensor unit via the color filter, the lens comprising a laminated film that includes first, second, and third layers made of a lens material; and
      a slit defined by an air cavity that is entirely surrounded by the lens material, the slit configured to reflect the incident light toward the sensor unit,
   wherein the first layer is on the color filter, the second layer is on the first layer, and the third layer is on the second layer,
   wherein, in a cross-sectional view, first, second, and third sides of the slit are defined by the second layer and a fourth side of the slit is defined by the third layer, and
   wherein the slit has a width of less than 100 nm.

15. The electronic apparatus of claim 14, wherein the lens is formed on the color filter without providing a planarization layer for removing a difference in level in the color filter.

* * * * *